United States Patent
Kim et al.

(10) Patent No.: US 7,595,084 B2
(45) Date of Patent: Sep. 29, 2009

(54) ORGANIC LIGHT EMITTING DEVICE AND METHOD OF MANUFACTURING THE SAME

(75) Inventors: Mu-Gyeom Kim, Hwaseong-si (KR); Sang-Yeol Kim, Gwacheon-si (KR); Vassili Leniachine, Suwon-si (KR); Mi-Jeong Song, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 78 days.

(21) Appl. No.: 11/834,949

(22) Filed: Aug. 7, 2007

(65) Prior Publication Data

US 2007/0270072 A1 Nov. 22, 2007

Related U.S. Application Data

(62) Division of application No. 11/020,671, filed on Dec. 27, 2004, now Pat. No. 7,268,489.

(30) Foreign Application Priority Data

Dec. 27, 2003 (KR) .................... 10-2003-0098228

(51) Int. Cl.
  *B05D 5/00* (2006.01)
  *H01J 1/00* (2006.01)
  *H01J 9/00* (2006.01)

(52) U.S. Cl. .................... 427/66; 427/58; 313/500; 313/505; 313/506; 313/512; 445/24; 445/25

(58) Field of Classification Search .................... 427/58, 427/66–68; 313/500, 503, 505, 506, 512; 445/24, 25
See application file for complete search history.

(56) References Cited

U.S. PATENT DOCUMENTS

| 6,091,195 | A | 7/2000 | Forrest et al. |
| 2004/0119028 | A1* | 6/2004 | McCormick et al. ... 250/492.22 |

* cited by examiner

*Primary Examiner*—Michael Kornakov
*Assistant Examiner*—Francis P. Smith
(74) *Attorney, Agent, or Firm*—H.C. Park & Associates, PLC

(57) ABSTRACT

An organic light emitting device can includes first and second metal layers used as electrodes on a substrate, an electron transport layer on the first metal layer, a first partition wall insulating the first metal layer from the second metal layer and extending onto the electron transport layer along the first metal layer, a second partition wall on the first metal layer around the electron transport layer, a third partition wall separated from the first partition wall and on the second metal layer, an organic light emitting layer on the electron transport layer, a hole transport layer on the organic light emitting layer and contacting the second metal layer, a protecting layer covering the hole transport layer and extending to the first and second metal layers beyond the second and third partition walls, and sealing materials filling spaces between the protecting layer and the first and second layers.

12 Claims, 5 Drawing Sheets

ORGANIC LIGHT EMITTING DEVICE AND METHOD OF MANUFACTURING THE SAME

CROSS-REFERENCE TO RELATED APPLICATION

This application is a divisional of prior U.S. patent application Ser. No. 11/020,671, filed on Dec. 27, 2004, and claims the benefit of Korean Patent Application No. 2003-98228, filed on Dec. 27, 2003, both of which are hereby incorporated by reference for all purposes as if fully set forth herein.

BACKGROUND OF THE INVENTION

1. Field of the Invention

The present invention relates to a light emitting device and a method of manufacturing the same. More particularly it relates to an organic light emitting device and a method of manufacturing the same.

2. Description of the Related Art

Top emitting light emitting devices may have superior light emitting efficiency compared to bottom emitting light emitting devices. Thus, the top emitting light emitting devices are more widely used for displays.

A conventional top emitting light emitting device, as illustrated in FIG. 1, can include a cathode layer 10, a light emitting layer 12 that emits light L, a hole transport layer 14, and an anode layer 16 formed sequentially. The anode layer 16 can be an indium tin oxide (ITO) layer, which is a conductive and transparent layer.

The ITO layer is deposited at a high temperature, and also subject to heat treatment to enhance conductivity. The deposition and heat treatment of the ITO layer are typically performed at a temperature of 400° C. or greater. However, light emitting material may not withstand such a the high temperature deposition process and the heat treatment process.

Thus, a method of depositing an ITO layer at a low temperature has been developed. However, when the ITO layer is deposited at a low temperature, the performance of the light emitting device degrades because the ITO layer breaks off. Accordingly, the desired result has not been obtained.

In addition, a conventional light emitting device has low out coupling efficiency. Out coupling efficiency is a measure of the amount of transmitted light compared to that amount plus the amount lost to total internal reflection. That is, light reflected from a boundary of elements having different reflective indices within an organic light emitting device can be reflected back inside the organic light emitting device.

This reflected light can be either substantially parallel to the substrate or substantially perpendicular to the substrate. Most of the light parallel to the substrate is emitted from the corners of the substrate. The light perpendicular to the substrate can be emitted to the desired direction by using a reflection layer on the opposite side from the substrate. The reflection layer can be formed separately from the anode layer.

However, of the initially reflected light from a boundary of elements, the light that is parallel to the substrate and leaks out of the organic light emitting device can be almost 50% of the total leakage light of the organic light emitting device. Therefore, the luminous efficiency is lower than desired.

SUMMARY OF THE INVENTION

The present invention relates, for example, to an organic light emitting device and a method of manufacturing the organic light emitting device that may help to alleviate the problems due to use of the ITO layer and may increase light emitting efficiency.

An organic light emitting device can include a substrate; first and second metal layers used as electrodes formed on the substrate; an electron transport layer formed on the first metal layer; a first partition wall that insulates the first metal layer from the second metal layer and extends onto the electron transport layer along the first metal layer; a second partition wall formed on the first metal layer around the electron transport layer; a third partition wall separated from the first partition wall and formed on the second metal layer; an organic light emitting layer formed on the electron transport layer; a hole transport layer formed on the organic light emitting layer, (covering the first partition wall and contacting an exposed portion of the second metal layer between the first and third partition walls); a protecting layer covering the hole transport layer and extending onto the first and second metal layers around the second and third partition walls; and a sealing material filling spaces between the protecting layer and the first and second metal layers.

A groove (which can be asymmetric) may be formed in the substrate. An inner surface of the groove may have a slight slope such that incident light parallel to the substrate is reflected upward. The first and second metal layers may extend toward the groove.

First and second steps may be formed in the groove. The second step may contact the bottom of the groove. The first step may be separated from the second step.

The first metal layer may extend to the second step across a portion of the inner surface of the groove where no steps are formed and across the bottom of the groove.

The second metal layer may cover the first step and the second metal layer extending to an upper surface of the substrate around the groove. Also, the second metal layer may extend to a flat surface of the substrate between the first and second steps.

A first coupling material may be formed on the first metal layer. A second coupling material combined with the first coupling material may be formed on the protecting layer. The first and second coupling materials may be a protruding portion and a groove respectively. The protruding portion may be designed to be inserted into the groove.

The electron transport layer may be a single layer or multiple layers having a work function between work functions of the organic light emitting layer and the first metal layer.

The substrate may comprise a base substrate forming the bottom of the groove and a glass substrate forming the inner surface of the groove.

An organic light emitting device according to the present invention does not require the inclusion of an ITO electrode layer. Therefore, the entire manufacturing process can be shorter and manufacturing costs can be lower. Moreover, the organic light emitting device of the present invention can be applied to flexible displays.

In addition, the organic light emitting device according to the present invention can improve luminance efficiency because it can include a reflecting material. Light emitted horizontally from an organic light emitting layer or reflected in a lateral direction can thus be reflected upward.

In an organic light emitting device manufactured according to the present invention, the surface state and thickness of the hole transport layer can have little effect on the performance of the organic light emitting device. That is, the organic light emitting device according to the present invention may have fewer factors that affect its performance. Moreover, the present invention may obviate the need for an indium-tinoxide (ITO) or indium-zinc-oxide (IZO) layer. Accordingly the fabrication temperature of the device may be reduced, and the organic material may be more easily preserved.

DETAILED DESCRIPTION OF THE INVENTION

Figure 1:
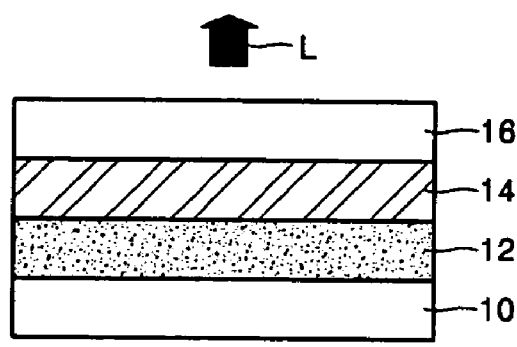
FIG. 1 is a cross-sectional view of a conventional organic light emitting device.

Exemplary embodiments of an organic light emitting device according to the present invention and a method of manufacturing the same will now be described in detail with reference to the attached drawings. In the drawings, the thicknesses of layers and sizes of regions are exaggerated for clarity.

According to an embodiment of the present invention, an anode layer of a conventional multi-layered organic light emitting device can be divided into two layers, and one of the two layers may be used as an anode layer and the other of the two layers may be used as a cathode layer. A separating partition wall may be interposed between the cathode layer and the anode layer. An organic light emitting layer may be formed on the cathode layer.

In addition, the organic light emitting layer and the anode layer may be interconnected by a hole transport layer that is transparent and conductive. As the partition wall extends on a slanted surface, out coupling efficiency of the organic light emitting device can be improved using the cathode layer. Detail constitutions of organic light emitting devices according to the present invention may differ as explained in the embodiments described below.

First Embodiment

Figure 2:
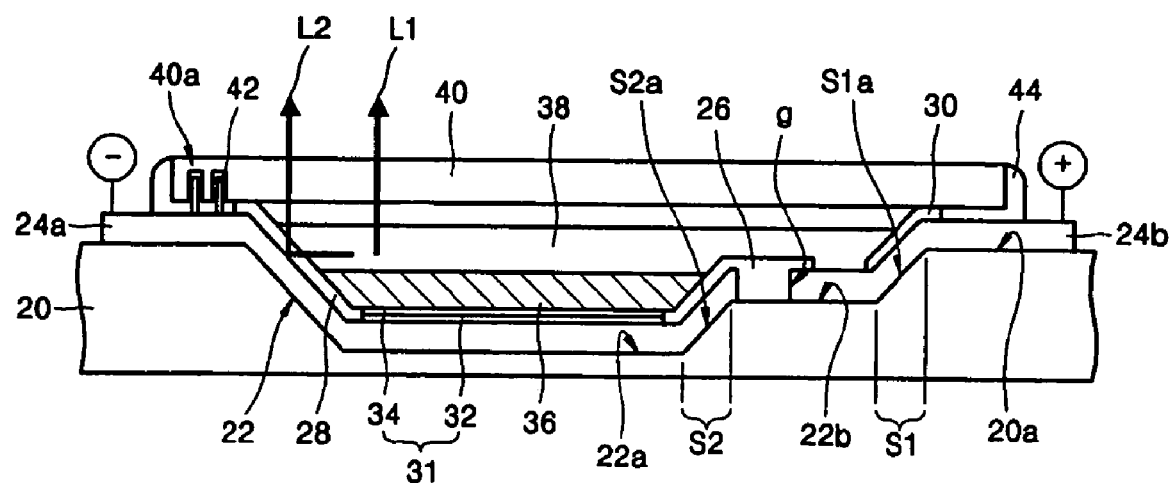
FIG. 2 is a cross-sectional view of an organic light emitting device according to a first embodiment of the present invention.

As shown in FIG. 2, a groove 22 having a predetermined depth may be formed in a substrate 20 of an organic light emitting device according to a first embodiment of the present invention (first organic light emitting device). The substrate 20 may be glass. A side surface of the groove 22 may have a slight slope.

First and second steps S1 and S2 may be formed on a portion of the side surface between a surface 20a of the substrate 20 and a bottom 22a of the groove 22. The first and second steps S1 and S2 may be horizontally separated from each other, have the same slopes, and may be vertically disposed at different heights. A horizontal surface 22b may lie between the first and second steps S1 and S2. The horizontal surface 22b may be lower than the surface 20a of the substrate 20, and may be disposed at approximately the midpoint between the surface 20a of the substrate 20 and the bottom 22a of the groove 22.

To increase the out coupling efficiency, the first and second steps S1 and S2 may have a slight slope like a portion of the groove 22 where steps are not formed. A first metal layer 24a and a second metal layer 24b may be formed on the substrate 20. The first and second metal layers 24a and 24b may be used as a cathode layer and an anode layer respectively. The first and second metal layers 24a and 24b may be composed of the same metal, for example, Al. Alternatively, the first and second metal layers 24a and 24b may be composed of other metals and may differ from one another in metal content.

The first and second metal layers 24a and 24b may extend on the surface of the groove 22. Specifically, the first metal layer 24a may extend from a top of the substrate 20 facing the first and second steps S1 and S2 to the horizontal surface 22b across the side surface (inner surface) of the groove 22, the bottom 22a of the groove 22, and the second step S2. The second metal layer 24b may extend from the top of the substrate 20 adjacent to the first step S1 to the horizontal surface 22b between the first and second steps S1 and S2 across the first step S1.

Even though both the first and second metal layers 24a and 24b extend to the horizontal surface 22b between the first and second steps S1 and S2, the first and second metal layers 24a and 24b may not contact each other. This may be because they are to be used as different electrodes. Therefore, a first partition wall 26 can be formed on the horizontal surface 22b between the first and second steps S1 and S2 to separate and insulate the first and second metal layers 24a and 24b.

The first partition wall 26 may be composed of an insulating film, for example a silicon oxide film. The first partition wall 26 may fill a gap g between the first and second metal layers 24a and 24b. The first partition wall 26 may extend on parts of the first and second metal layers 24a and 24b. Specifically, in the direction of the second metal layer, the first partition wall 26 may extend onto only a portion of the second metal layer 24b, but in the direction of the first metal layer extends on an edge of the bottom 22a of the groove 22 across the second step S2. An electron transport layer 31 may be formed on the first metal layer 24a formed on the bottom 22a of the groove 22. The thickness of the electron transport layer 31 may be equal to that of a portion of the first partition wall 26 extending onto the first metal layer 24a.

The electron transport layer 31 may be a single or multiple layer structure having an appropriate work function so that electrons can easily migrate from the first metal layer 24a to a light emitting layer 36 provided on the electron transport layer 31. When the electron transport layer 31 is a single layer, the electron transport layer 31 may be, for example, a Ba layer. When the electron transport layer 31 is a multiple layer, the electron transport layer 31 may include first and second electron transport layers 32 and 34 stacked sequentially. The first electron transport layer 32 may be, for example, a Ca layer, and the second electron transport layer 34 may be, for example, a $Ba_2F$ layer. A second partition wall 28 may be formed on the first metal layer 24a. The second partition wall 28 may contact the electron transport layer 31 across a slanted surface of the first metal layer 24a. The second partition wall 28 may be composed of the same material as the first partition wall 26.

The first and second partition wall 26 and 28 may be formed simultaneously during the manufacturing process. Accordingly, the thickness of the second partition wall 28 may be equal to the thickness of a portion of the first partition wall 26 extending onto the first metal layer 24a.

A portion of the second metal layer 24b corresponding to the first step S1 may be covered by a third partition wall 30. The third partition wall 30 is composed of the same material as the first partition wall 26. The third partition wall 30 and the first partition wall 26 are separated on the second metal layer 24b. The third partition wall 30 is simultaneously formed together with the first and second partition walls 26 and 28.

Accordingly, the thickness of the third partition wall 30 may be equal to the thickness of the second partition wall 28. A light emitting layer 36, from which light is generated by the recombination of carriers provided from the first and second metal layer 24a and 24b, may be formed on the electron transport layer 31. The light emitting layer 36 may contact extended portions of the second partition wall 28 and the first partition wall 26. The light emitting layer 36 may be a low molecular fluorescent layer, a high molecular fluorescent layer, or a phosphor layer.

An upper surface of the light emitting layer 36 may be disposed lower than an upper surface of the first partition wall 26. A hole transport layer 38 may be formed on the light emitting layer 36. One side of the hole transport layer 38 may contact the second partition wall 28, and the other side of the hole transport layer 38 may cover the first partition wall 26 and may contact the third partition wall 30 and a portion of the second metal layer 24b exposed between the first and third partition walls 26 and 30.

An upper surface of the hole transport layer 38 may be disposed lower than upper surfaces of the first and second metal layers 24a and 24b. The hole transport layer 38 may transport holes from the second metal layer 24b that is an anode layer to the light emitting layer 36. The work function of the hole transport layer 38 may be like that of the second metal layer 24b so that holes can be easily injected into the hole transport layer 38.

The hole transport layer 38 may be a material layer having good conductivity. This may be because it may be used to transport holes to a light emitting area. A protecting layer 40 may be separated from the hole transport layer 38 by a predetermined distance. The protecting layer 40 may be a glass layer or a thin film, for example an Au film.

The protecting layer 40 may extend onto the first and second metal layers 24a and 24b formed on the substrate 20 outside of the groove 22, and may contact the second and third partition walls 28 and 30 at the border of the groove 22. Spaces between portions of the protecting layer 40 extending beyond the second and third partition walls 28 and 30 and the first and second metal layers 24a and 24b may be filled with a sealing material 44 such as a UV resin.

For virtually perfect sealing, a comb-like protruding portion 42 may be formed on a predetermined region of the first metal layer 24a and/or the second metal layer 24b facing the protecting layer 40, such as a region outside the groove 22 of the first metal layer 24a. In addition, the protecting layer 40 may have a groove 40a, in which the protruding portion 42 is inserted. In this case, the sealing material 44 may lie between the protruding portion 42 and the groove 40a.

The sealing may be completed as follows. The sealing material 44 may be dropped onto a region where the protruding portion 42 of the first metal layer 24a is formed, the protecting layer 40 may be arranged such that the protruding portion 42 is inserted into the groove 40a, and then the protecting layer 40 may be pressed.

In FIG. 2, an arrow L1 represents light emitted upward from the organic light emitting layer 36, or light reflected upward by the first metal layer 24a below the organic light emitting layer 36. An arrow L2 represents light reflected upward by the slanted surface of the first metal layer 24a. Light approximately parallel to the upper surface of the organic light emitting layer 36 (whether emitted from the organic light emitting layer 36 or reflected from the upper surface of the organic light emitting layer 36 into the organic light emitting layer 36) may be incident to the slanted surface of the first metal layer 24a.

Second Embodiment

An organic light emitting device according to a second embodiment of the present invention (second organic light emitting device) may have an embossed form.

Figure 3:
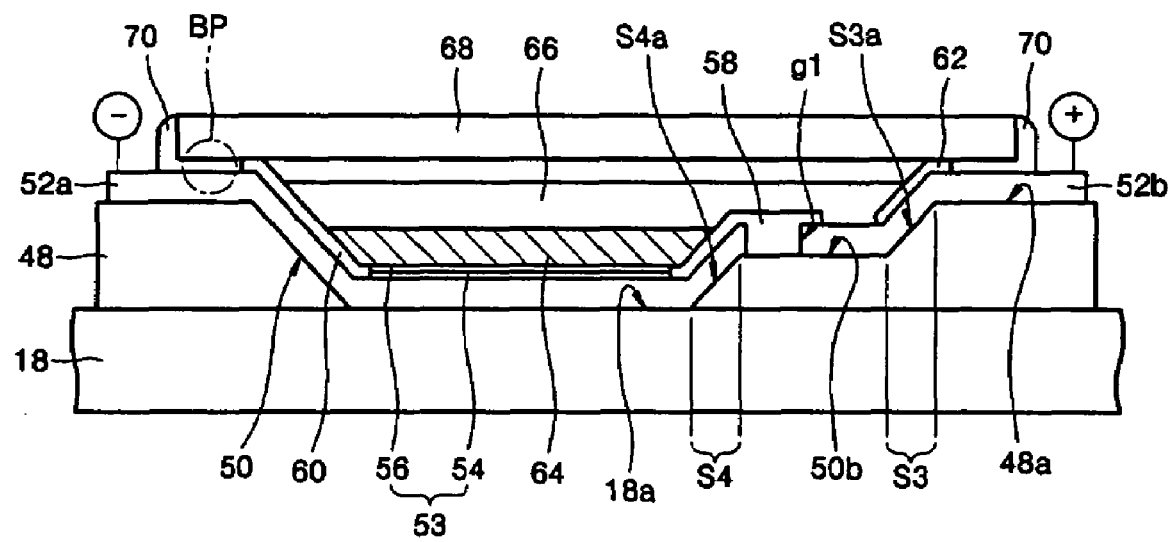
FIG. 3 is a cross-sectional view of an organic light emitting device according to a second embodiment of the present invention.

As shown in FIG. 3, the second organic light emitting device can include a glass substrate 48 on a base substrate 18. A penetrating hole 50 exposing the base substrate may be formed in the glass substrate 48. The inner surface of the penetrating hole 50 may have the same form as the side surface of the groove 22 formed in the substrate 20 of the first organic light emitting device (see FIG. 2). Also, the base substrate 18 may lie beneath the penetrating hole 50.

Accordingly, the penetrating hole 50 may become functionally the same as the groove 22 formed in the substrate 20 of the first organic light emitting device. A portion 18a of the base substrate 18 exposed through the penetrating hole 50 may have the same form as the bottom 22a of the groove 22. The penetrating hole 50 may have third and fourth steps S3 and S4 in a portion of the inner surface between the exposed portion 18a of the base substrate 18 and a surface 48a of the glass substrate 48.

A flat surface 50b may be in between the third and fourth steps S3 and S4. The inner surfaces of the penetrating hole 50 and the third and fourth steps S3 and S4 may have slight slopes. The third and fourth steps S3 and S4 may be the same as the first and second steps S1 and S2 formed in the groove 22 of the first organic light emitting device.

Third and fourth metal layers 52a and 52b may be formed on the glass substrate 48. The third and fourth metal layers 52a and 52b may be like the first and second metal layers 24a and 24b of the first organic light emitting device. The third metal layer 52a may extend from the top of the glass substrate 48 facing the third and fourth steps S3 and S4 to the flat surface 50b between the third and fourth steps S3 and S4 across the inner surface of the penetrating hole 50, the exposed surface 18a of the base substrate 18, and the slanted surface of the fourth step S4.

The fourth metal layer 52b may be formed on a portion of the glass substrate 18 in which the third and fourth steps S3 and S4 are formed. The fourth metal layer 52b may extend to the flat surface 50b formed between the third and fourth steps S3 and S4 across the third step S3. The third and fourth metal layers 52a and 52b may be separated on the flat surface 50b.

A fourth partition wall 58 filling a gap g1 between the third and fourth metal layers 52a and 52b may be formed on the flat surface 50b. The fourth partition wall 58 may be like the first partition wall 26 of the first organic light emitting device.

An electron transport layer 53 may be formed on a portion of the third metal layer 52a extending onto the base substrate 18. The electron transport layer 53 may include third and fourth electron transport layers 54 and 56 stacked sequentially. The third and fourth electron transport layers 54 and 56 may be the same as the first and second electron transport layers 32 and 34 of the first organic light emitting device.

The electron transport layer 53 may be a single layer. A fifth partition wall 60 may be formed on the slanted portion of the penetrating hole 50 where no steps are formed. One end of the fifth partition wall 60 may extend toward the base substrate 18, contacting the electron transport layer 53, and the other end of the fifth partition wall 60 may extend on the third metal layer 52a around the penetrating hole 50.

The third step S3 of the fourth metal layer 52b may be covered by a sixth partition wall 62. The sixth partition wall 62 may extend on the fourth metal layer 52b around the penetrating hole 50. The fourth partition wall 58 and the sixth partition wall 62 may be separated by a predetermined distance, and a portion of the fourth metal layer 52b may be exposed through the distance between the fourth and sixth partition wall 58 and 63.

The electron transport layer 53 may be covered by an organic light emitting layer 64. The organic light emitting layer 64 may contact a portion of the fourth partition wall 58 extending onto the fourth step S4 and the fifth partition wall 60. An upper surface of the organic light emitting layer 64 may be disposed lower than an upper surface of the fourth partition wall 58.

A hole transport layer 66 may lie on the organic light emitting layer 64. An upper surface of the hole transport layer 66 may be disposed lower than upper surfaces of the third and fourth metal layers 52a and 52b. The hole transport layer 66 may be like the hole transport layer 38 of the first organic light emitting device.

The hole transport layer 66 may contact the fifth and sixth partition walls 60 and 62, cover the fourth partition wall 58, and contact a portion of the fourth metal layer 52b exposed between the fourth and sixth partition walls 58 and 62.

By the above contacts, holes can be transported from the fourth metal layer 52b to the organic light emitting layer 64 through the hole transport layer 66. Electrons can be transported from the third metal layer 52a to the organic light emitting layer 64 through the electron transport layer 53. The electron transport layer 53 can have a predetermined work function between work functions of the third metal layer 52a and the organic light emitting layer 64. The holes and the electrons transported in this way may be combined in the organic light emitting layer 64 to emit light.

The light emitted from the organic light emitting layer 64 approximately parallel to the upper surface of the organic light emitting layer 64 may be reflected upward at slanted portions of the third and fourth metal layers 52a and 52b. Thus, such light may contribute to the overall emitted light.

In addition, emitted light that is obliquely incident to the upper surface of the organic light emitting layer 64 may be reflected into the organic light emitting layer 64. Emitted light toward the base substrate 18 that is almost perpendicular to an upper surface of the organic light emitting layer 64 may be reflected at the base substrate 18, and then emitted upward. On the other hand, light parallel or almost parallel to the upper surface of the organic light emitting layer 64 may be reflected upward at the slanted portions of the third and fourth metal layers 52a and 52b.

Therefore, the light emitted parallel to the upper surface of the organic light emitting layer 64, and the light emitted from the border of the organic light emitting layer 64 to the inside of the organic light emitting layer 64 contribute to the total emitted light. Thus, the out coupling efficiency of the second organic light emitting device (the luminescent efficiency) may be much better than that of a conventional organic light emitting device.

As shown in FIG. 3, a protecting layer 68 may be formed above the hole transport layer 66, and they may be separated by a predetermined space. The protecting layer 68 may prevent external harmful materials such as dust and humidity from entering the second organic light emitting device. The protecting layer 68 may cover the entire surface of the hole transport layer 66, contacts the fifth and sixth partition walls 60 and 62 around the hole transport layer 66, and may cover portions of the third and fourth metal layers 52a and 52b beyond the fifth and sixth partition walls 60 and 62. A space may exist between the hole transport layer 66 and the protecting layer 68. The space may be filled with an inert gas such as nitrogen.

However, because of the fifth and sixth partition walls 60 and 62, spaces may be formed between the protecting layer 68 and the third and fourth metal layers 52a and 52b. The spaces may be completely filled with a sealing material 70 between the protecting layer 68 and the third and fourth metal layers 52a and 52b. For perfect sealing, a protruding portion and a groove into which the protruding portion is inserted may be formed in a predetermined region BP of the protecting layer 68 and the third metal layer 52a. The protruding portion and the groove may be like the protruding portion 42 and the groove 40a of the first organic light emitting device.

Third Embodiment

An organic light emitting device engraved in a substrate such as the first organic light emitting device is described below. The organic light emitting device can have a doped area instead of a metal layer as a cathode layer.

Figure 4:
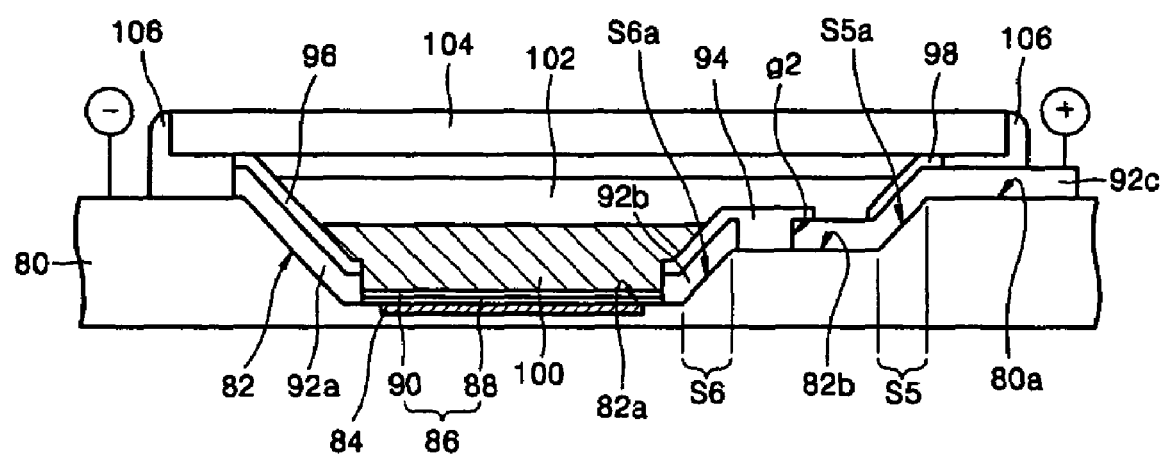
FIG. 4 is a cross-sectional view of an organic light emitting device according to a third embodiment of the present invention.

As shown in FIG. 4, the organic light emitting device according to the third embodiment of the present invention (third organic light emitting device) can include a substrate 80. A groove 82 may be formed in the substrate 80. The groove 82 may have a depth. The substrate 80 may be a silicon substrate doped with a conductive impurity such as a p-type silicon substrate.

An inner surface of the groove 82 may have a slight slope. A slight slope may improve the out coupling efficiency of light reflected approximately parallel to the substrate 80. A portion of the inner surface of the groove 82 may include fifth and sixth steps S5 and S6. The fifth step S5 may be separated by a predetermined space apart from the sixth step S6. The fifth step S5 may be disposed higher than the sixth step S6.

The flat surface 82b may be formed between the fifth and sixth steps S5 and S6. The flat surface 82b may be disposed lower than a top surface of the substrate 80 and higher than the bottom 82a of the groove 82. An inner surface S5a of the fifth step S5 and an inner surface S6a of the sixth step S6 may have the same slant as an inner surface of a portion of the groove 82 where steps are not formed.

A region 84 in which conductive impurities are doped to a predetermined depth may be formed in the bottom 82a of the groove 82. The doped region 84, which is injected with an n-type impurity, may be used as a cathode layer such as the first metal layer 24a of the first organic light emitting device or the third metal layer 52a of the second organic light emitting device.

A negative voltage may be applied to the doped region 84 through the substrate 80. The entire surface of the doped region 84 may be covered by an electron transport layer 86. The electron transport layer 86 may extend on the bottom 82a of the groove around the doped region 84.

The electron transport layer 86 may include fifth and sixth electron transport layers 88 and 90 stacked sequentially. The fifth and sixth electron transport layers 88 and 90 may be like the first and second electron transport layers 32 and 34 of the first organic light emitting device respectively.

The electron transport layer 86 may be a single layer. A portion of the inner surface of the groove 82 where steps are not formed may be covered by a fifth metal layer 92a. The fifth metal layer 92a may be, for example, an Al layer. The fifth metal layer 92a may cover the inner surface between the substrate 80 and the electron transport layer 86, and may contact the electron transport layer 86.

The sixth step S6, which may be sloped and face the inner surface of the groove 82 where steps are not formed, may be covered by a sixth metal layer 92*b*. The sixth metal layer 92*b* may be like the fifth metal layer 92*a*, and may likewise be an Al layer. The sixth metal layer 92*b* may extend to the flat surface 82*b*, and contact the electron transport layer 86.

The fifth step S5 may be covered by a seventh metal layer 92*c*. The seventh metal layer 92*c* may be used as an anode layer. The seventh metal layer 92*c* may extend onto an upper surface 80*a* of the substrate 80, and may cover a portion of the flat surface 82*b* between the fifth and sixth steps S5 and S6.

The seventh metal layer 92*c* may be like the fifth and sixth metal layers 92*a* and 92*b*. The sixth metal layer 92*b* and the seventh metal layer 92*c* may be separated by a gap g2 on the flat surface 82*b*. The gap g2 may be completely filled by a seventh partition wall 94. The seventh partition wall 94 may extend onto a portion of the seventh metal layer 92*c*, and onto the sixth metal layer 92*b*.

The seventh partition wall 94 may cover the entire upper surface of the sixth metal layer 92*b*. An eighth partition wall 96 may be formed on the entire upper surface of the fifth metal layer 92*a*. A slanted surface of the seventh metal layer 92*c* corresponding to the slanted surface S5*a* of the fifth step S5 may be covered by a ninth partition wall 98. The ninth partition wall 98 may be formed along a surface of the seventh metal layer 92*c*.

The seventh partition wall 94 and the ninth partition wall 98 may be separated by a predetermined distance on the seventh metal layer 92*c*, and a portion of the seventh metal layer 92*c* may be exposed through the distance between the ninth partition wall 98 and the seventh metal layer 92*c*. The electron transport layer 86 may be covered by an organic light emitting layer 100 having a predetermined thickness.

The organic light emitting layer 100 may contact the fifth metal layer 92*a*, the eighth partition wall 96 around the electron transport layer 86, the sixth metal layer 92*b*, and the seventh partition wall 94. An upper surface of the organic light emitting layer 100 may be disposed lower than the upper surface of the seventh metal layer 92*c*.

A hole transport layer 102 is formed on the organic light emitting layer 100. The hole transport layer 102 may act like the hole transport layer 38 of the first organic light emitting device, and may be composed of the same material as the hole transport layer 38 of the first organic light emitting device.

The hole transport layer 102 may contact the eighth partition wall 96, cover an exposed portion of the upper surface of the seventh partition wall 94, and contact the ninth partition wall 98 and a portion of the seventh metal layer 92*c* exposed between the seventh and ninth partition walls 94 and 98. An upper surface of the hole transport layer 102 may be disposed lower than an upper surface of an upper portion of the seventh metal layer 92*c* around the fifth step S5.

A protecting layer 104 may be formed over the hole transport layer 102, with a predetermined space between them. The protection layer 104 may cover the entire surface of the hole transport layer 102, contact the eighth and ninth partition walls 96 and 98, and extend beyond the eighth and ninth partition walls 96 and 98.

Spaces between a portion of the protecting layer 104 around the eighth partition wall 96, and between a portion of the protecting layer 104 around the ninth partition wall 98 and the seventh metal layer 92*c* may be completely sealed with a sealing material 106. That is, the circumference of the protecting layer 104 may be completely sealed by the sealing material 106. A space may exist between the hole transport layer 102 and the protecting layer 104. The space may be filled with an inert gas such as nitrogen.

The protection layer 104 may act like the protecting layer 40 of the first organic light emitting device.

Fourth Embodiment

Figure 5:
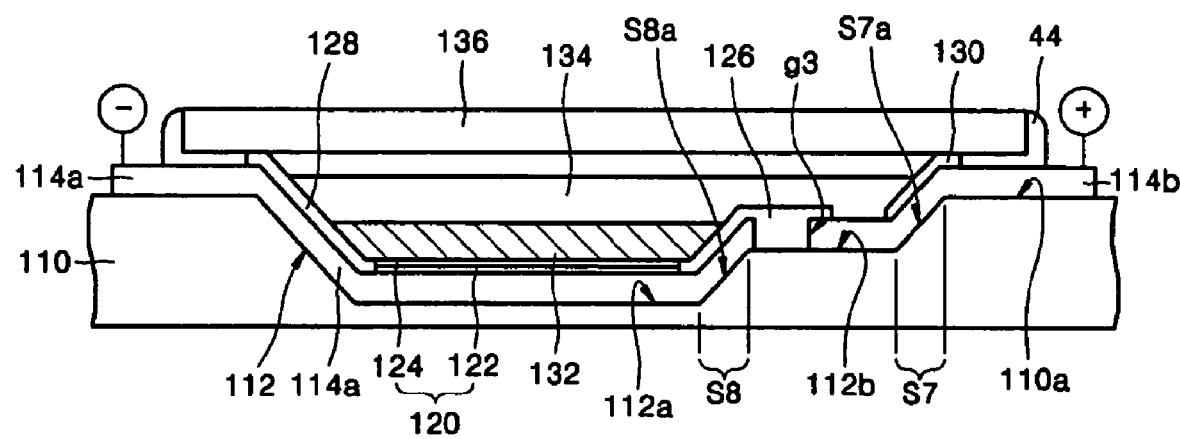
FIG. 5 is a cross-sectional view illustrating an organic light emitting device according to a fourth embodiment of the present invention.

As shown in FIG. 5, an organic light emitting device (fourth organic light emitting device) according to a fourth embodiment of the present invention may include a substrate 110 having a groove 112 formed to a predetermined depth. The substrate 110 may be a flexible substrate such as a plastic substrate.

The inner surface of the groove 112 may be a slanted surface by which light incident to the slanted surface substantially parallel to the bottom of the groove 112 may be reflected almost straight upward. The groove 112 may be asymmetrical with respect to the bottom 112*a*. That is, with respect to the bottom 112*a*, a portion of the inner surface of the groove 112 may have a slight slope connecting the bottom 112*a* and an upper surface 10*a* of the substrate 110. The other portion of the inner surface of the groove 112 facing the portion may include a seventh and eighth steps S7 and S8.

The eighth step S8 may start at the bottom 112*a* of the groove 112. The seventh step S7 may be horizontally separated from the eighth step S8 by a predetermined distance. The seventh step S7 may be disposed higher than the eighth step S8. A flat surface 112*b* may be formed between the seventh and eighth steps S7 and S8. The flat surface 112*b* may be disposed higher than the bottom 112*a* of the groove 112 and lower than the upper surface 110*a* of the substrate 110.

The seventh step S7 may start at the flat surface 112*b*. The eighth step S8 may end at the flat surface 112*b*. An eighth metal layer 114*a* that may be used as a cathode layer and a ninth metal layer 114*b* that may be used as an anode layer may be formed on the substrate 110. A predetermined gap g3 may lie between the eighth and ninth metal layers 114*a* and 114*b*. The eighth metal layer 114*a* may extend to the flat surface 112*b* and across the inner surface of the groove 112 where steps are not formed, the bottom 112*a* of the groove 112, and the eighth step S8.

The ninth metal layer 114*b* may cover the seventh step S7. The ninth metal layer 114*b* may extend to the upper surface 110*a* of the substrate 110, and may extend to the flat surface 112*b*. The gap g3 between the eighth and ninth metal layers 114*a* and 114*b* may be filled by a tenth partition wall 126.

The tenth partition wall 126 may act like the first partition wall 26 of the first organic light emitting device and may extend to the bottom 112*a* of the groove 112 along the surface of the eighth metal layer 114*a*. An electron transport layer 120 may be formed on a portion of the eighth metal layer 114*a* disposed on the bottom 112*a* of the groove 112. The electron transport layer 120 may include seventh and eighth electron transport layers 122 and 124. The electron transport layer 120 may be like the electron transport layer 31 of the first organic light emitting device.

An eleventh partition wall 128 may be formed on a slanted portion of the eighth metal layer 114*a*. The eleventh partition wall 128 may extend onto the upper surface of the eighth metal layer 114*a*. The eleventh partition wall 128 may contact the electron transport layer 120.

A twelfth partition wall 130 may be formed on a slanted portion of the ninth metal layer 114*b*. The twelfth partition wall 130 may extend onto the upper surface of the ninth metal layer 114*b* formed on the upper surface of the substrate 110. The twelfth partition wall 130 may extend toward the tenth partition wall 126 with a predetermined distance between the tenth and twelfth partition walls 126 and 130.

The ninth metal layer 114b may be exposed through the space between the tenth and twelfth partition walls 126 and 130. During the manufacturing process, the tenth through twelfth partition walls 126, 128, and 130 may be formed simultaneously. Thus, the thicknesses of the eleventh and twelfth partition walls 128 and 130 may be equal to that of a portion of the tenth partition wall 126 extending onto the eighth metal layer 114a.

The electron transport layer 120 may be covered by an organic light emitting layer 132 having a predetermined thickness. The organic light emitting layer 132 may be like the organic light emitting layer 36 of the first organic light emitting device. One end of the organic light emitting layer 132 may contact the eleventh partition wall 128, and the other end of the organic light emitting layer 132 may contact the extended portion of the tenth partition wall 126.

An upper surface of the light emitting layer 132 may be disposed lower than the upper surface of a portion of the ninth metal layer 114b exposed between the tenth and twelfth partition walls 126 and 130. A hole transport layer 134 having a predetermined thickness may be formed on the organic light emitting layer 132. The hole transport layer 134 may act like the hole transport layer 66 of the first organic light emitting device.

One end of the hole transport layer 134 may contact the eleventh partition wall 128, and the other end of the hole transport layer 134 may contact the twelfth partition wall 130. In addition, the hole transport layer 134 may contact an exposed portion of the ninth metal layer 11b between the tenth and twelfth partition walls 126 and 130, and may cover the tenth partition wall 126. Therefore, when a voltage is applied to the ninth metal layer 114b used as an anode layer, carriers (that is, holes) may be transported to the organic light emitting layer 132 through the hole transport layer 134.

Because the holes flow on the surface of the tenth partition wall 126, the surface state of the hole transport layer 134 may not substantially affect the transportation of the hole. Thus, the surface state of the hole transport layer 134 may not be very important in the design considerations for the hole transport layer 134.

An upper surface of the hole transport layer 134 may be disposed lower than upper surfaces of the eighth and ninth metal layers 114a and 114b around the eleventh an twelfth partition walls 128 and 130. This arrangement of layers may ease the sealing process.

A protecting transport layer 136 may be formed above the hole transport layer 134. The protecting layer 136 may cover the entire surface of the hole transport layer 134 and the eleventh and twelfth partition walls 128 and 130 and may extend over the eighth and ninth metal layers 114a and 114b. The protecting layer 136 may closely contact the eighth and ninth metal layers 114a and 114b. This close contact may help to prevent external impurities and humidity from penetrating under the protecting layer 136.

The first through fourth organic light emitting devices described above may include a reflecting means: metal layers having slight slopes around organic light emitting layers 36, 64, 100, and 132. The metal layers may reflect incident light upward.

Accordingly, lateral light emitted from the organic light emitting layers 36, 64, 100, and 132 and the light emitted from the upper surfaces of the organic light emitting layers 36, 64, 100, and 132 to the insides of the first through fourth organic light emitting devices in a lateral direction may be reflected upward. As a result, the out coupling efficiencies of the first through fourth organic light emitting devices of the present invention may be higher than the out coupling efficiency of the prior art.

In addition, the anode layer and the cathode layer may be formed horizontally instead of vertically. Thus, the organic light emitting device may be thinner.

A method of manufacturing an organic light emitting device according to exemplary embodiments of the present invention will now be described.

Even though some of the substrates of the first, second, and fourth organic light emitting devices may be embossed and others may be engraved, methods of manufacturing the first, second, and fourth organic light emitting devices may not substantially differ from each other. By way of illustration, therefore, only methods of manufacturing the first and third organic light emitting devices will now be described. The method of manufacturing the first organic light emitting device can be readily applied to the second and fourth organic light emitting devices.

<Manufacturing of First Embodiment>

As shown in FIG. 2, a groove 22 having a predetermined depth may be formed in a substrate 20. The substrate 20 may be a glass substrate or a flexible substrate such as a plastic substrate. When forming the groove 22, a mask engraved with the same pattern as the groove 22 may be used.

The groove 22 may be formed wide enough to be able to include important elements of the first organic light emitting device. The width of the groove 22 may increase toward the inlet of the groove 22, and an inner surface of the groove 22 may have a slight slope. The groove 22 may be asymmetrically formed centering on the bottom 220 of the groove 22.

To form anode and cathode layers horizontally, a portion (in FIG. 2, a portion of the inner surface of the groove 22 disposed to the left side of the bottom 22a) of the inner surface of the groove 22 on which a cathode layer is to be formed, may be given a slight slope, and first and second steps S1 and S2 may be formed in a portion (in FIG. 2, a portion of the inner surface disposed to the right side of the bottom 22a) of the groove 22 where an anode layer is to be formed.

The first and second steps S1 and S2 may be horizontally separated by a predetermined distance, and the first step S1 may be disposed higher than the second step S2. The second step S2 may begin at an edge of the bottom 22a of the groove 22, and a flat surface 22b may be formed between the first and second steps S1 and S2. The flat surface 22b may be disposed lower than a top surface 20a of the substrate 20 and higher than the bottom 22a of the groove 22.

When the first and second steps S1 and S2 are formed, a surface S1a of the first step S1 and a surface S2a of the second step S2 may have the same gradient as the inner surface of the groove 22.

After the groove 22 is formed, a portion of the flat surface 22b of the groove 22 may be covered using a mask (not shown). A metal layer (not shown) may be formed to a predetermined thickness on the substrate 20. The metal layer may be, for example, an aluminum layer.

After the metal layer is formed, the mask may be removed. As a result, a first metal layer 24a used as a cathode layer and a second metal layer 24b used as an anode layer may be formed on the substrate 20. The first metal layer 24a may extend to the flat surface 22b of the groove 22 across the inner surface of the groove 22 where steps are not formed, the bottom 22a of the groove 22, and the second step S2. The second metal layer 24b may extend to the flat layer 22b across the first step S1.

Even though both the first and second metal layers 24a and 24b may extend onto the flat surface 22b of the groove, they may be separated by a gap g formed on the flat layer 22b of the groove 22 using the mask. The gap g may be sufficient to prevent a carrier provided to the first and second metal layers 24a and 24b from tunneling between the first and second metal layers 24a and 24.

Next, a mask (not shown) is formed to cover a region of the bottom 22a of the groove 22 in which an electron transport layer 31 is to be formed, a portion of the second metal layer 24b formed on the flat surface 22b of the groove 22, and the first and second metal layers 24a and 24b formed around the groove 22. An insulating layer (not shown), such as a silicon oxide film, filling the gap g between the first and second metal layers 24a and 24b may be formed on the substrate 20 where the mask is formed. Next, the mask is then removed.

As a result, a first partition wall 26 filling the gap g between the first and second metal layers 24a and 24b may be formed. The first partition wall 26 may extend to the bottom 22a of the groove 22 across the second step S2. A second partition wall 28 covering the sloped surface of the groove 22 without steps may be formed. A third partition wall 30 may be formed covering the second step S2. The thickness of a portion of the first partition wall 26 extending to the bottom 22b of the groove 22 may equal that of the second and third partition walls 28 and 30.

An electron transport layer 31 may be formed on the bottom 22a of the groove 22 between the first and second partition walls 26 and 28. The electron transport layer 31 may be formed with a material layer capable of matching work functions of both the metal layer 24a and an organic light emitting layer 36 to be formed in a subsequent process. The electron transport layer 31 may be a formed of a single layer or multiple layers.

If the electron transport layer 31 is formed with a single layer, it may be formed of a Ba layer. If the electron transport layer 31 is formed with multiple layers, it may be formed with first and second electron transport layers 32 and 34. The first electron transport layer 32 may be formed of a Ca layer, and the second electron transport 34 may be formed of a $BaF_2$ layer.

A mask (not shown), which exposes the electron transport layer 31 and portions of the first and second partition walls 26 and 28 around the electron transport layer 31 and covers the rest area is formed. The organic light emitting layer 36 is formed on the electron transport layers 31 and portions of the first and second partition walls 26 and 28, and then the mask is removed. The organic light emitting layer may be formed with a low or high molecular weight fluorescent layer or a phosphor layer.

After the organic light emitting layer 36 is formed, a mask that exposes the organic light emitting layer 36, the first partition wall 26, the exposed portion of the second metal layer 24b between the first and third partition walls 26 and 30, and portions of the second and third partition walls 28 and 30 adjacent to the organic light emitting layer 36 may be formed. A hole transport layer 38 having a predetermined thickness may be formed on the entire exposed region using the mask. While the hole transport layer 38 is formed, an upper surface of the hole transport layer 38 may be formed lower than upper surfaces of the first and second metal layers 24a and 24b for convenience in subsequently sealing the device.

During the operation of the organic light emitting device, holes provided by the second metal layer 24b (which may be an anode layer) may be transported through a portion of the hole transport layer 38 that is close to a material layer formed below the hole transport layer 38. Therefore, the surface of the hole transport layer 38 may be formed by planarization or by any other suitable method.

A protecting layer 40 is formed to protect the hole transport layer 38 and components formed therebelow from impurities and humidity. The protecting layer 40 may be formed with a glass layer or a gold layer. The protecting layer 40 extends beyond the second and third partition walls 28 and 30. The second and third partition walls 28 and 30 formed on the upper surfaces of the first and second metal layers 24a and 24b may support and contact the protecting layer 40. A gap may be formed in between the protecting layer 40 and the hole transport layer 38.

After the protecting layer 40 is formed, a space between the protecting layer 40 and the first and second metal layer 24a and 24b may be filled with a sealing material 44. The sealing material 44 may be a material that prevents external impurities such as moisture and air from penetrating. For example, the sealing material 44 may be a UV resin. For the sealing process, the sealing material 44 may be first prepared where the sealing is to be performed, and then the protecting layer 40 may be contacted with the sealing material 44 and pressure may be applied to the protecting layer 40 to complete the sealing process.

To improve sealing where the sealing material 44 is formed between the first and second metal layers 24a and 24b and the protecting layer 40, a protruding portion 42 (a first coupling material) may be formed in the first metal layer 24a, and a groove 40a (a second coupling material matched with the first coupling material) may be formed in the protecting layer 40. The first coupling material may be formed in the second metal layer 24b.

If the first and second coupling materials are formed in the first and second metal layers 24a and 24b and the protecting layer 40, the first and second metal layers 24a and 24b and the protecting layer 40 may be sealed in a manner described below.

A portion where the first coupling material is formed may be covered with the sealing material 44. The protecting layer 40 may be arranged so that the first and second coupling materials are exactly combined, and then the protecting layer 40 may be pressed.

In the sealing process, it may be preferable that spaces between portions of the protecting layer 40 extending beyond the second and third partition walls 28 and 30 and the first and second metal layers 24a and 24b may be completely filled.

As shown in FIG. 3, a method of manufacturing the second organic light emitting device can include forming a glass substrate 48 on a base substrate 18 and forming a penetrating hole 50 in the glass substrate 48 that exposes the base substrate 18. The inner surface of the penetrating hole 50 may be the same as the inner surface of the groove 22. Since the bottom of the penetrating hole 50 is blocked by the base substrate 18, the penetrating hole 50 may be like the groove 22 formed according to the manufacturing method according to the first embodiment of the present invention.

After forming the penetrating hole 50, the manufacturing process is identical to the manufacturing process according to the first embodiment by the present invention described above.

Figure 6:
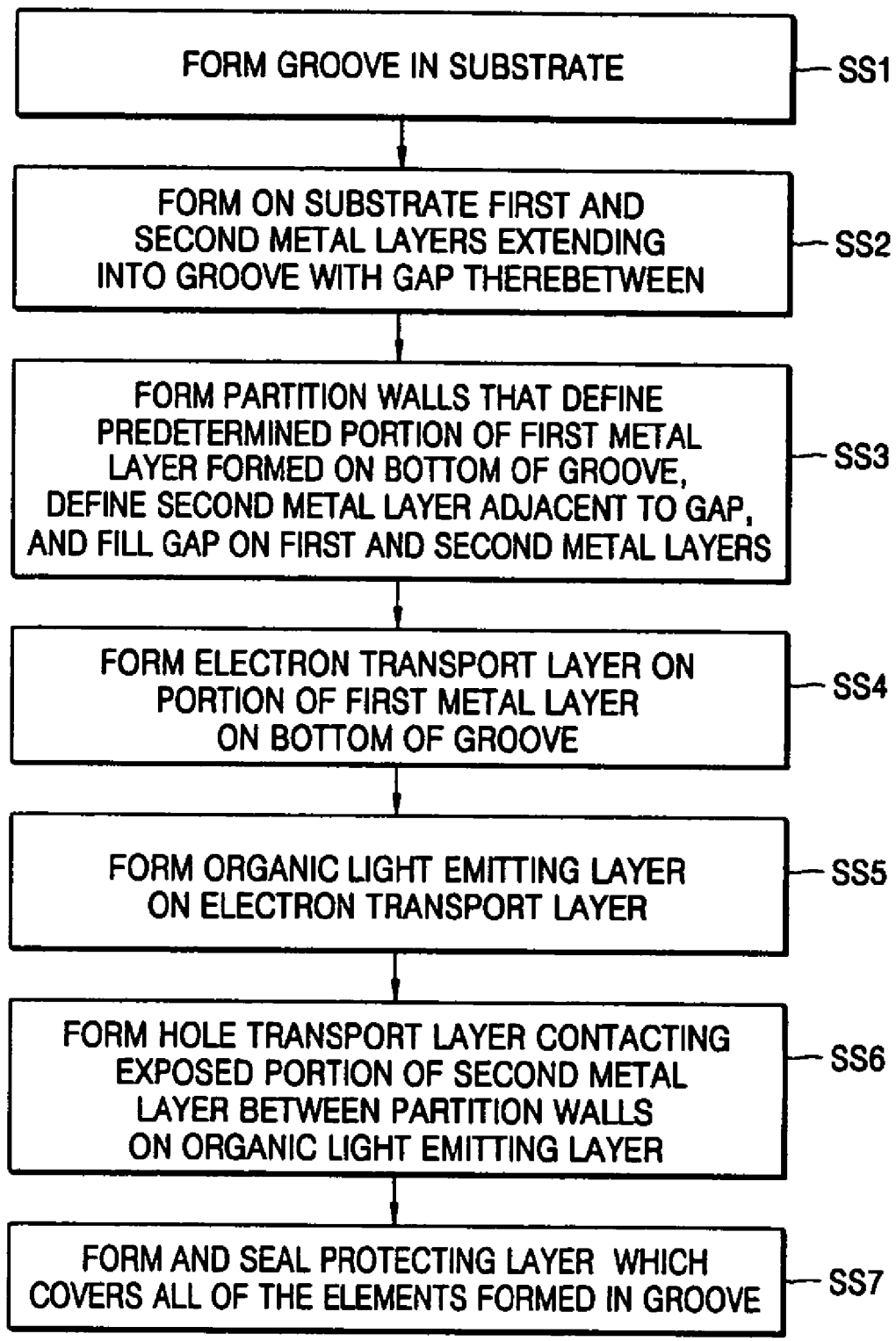
FIGS. 6 and 7 are flow charts illustrating methods of manufacturing organic light emitting devices according to the first and second embodiments of the present invention.

As shown in FIG. 6, the manufacturing method according to the first embodiment of the present invention can be summarized as follows. The method of manufacturing an organic light emitting device according to the first embodiment may include forming a groove in a substrate (SS1); forming first and second metal layers on the substrate extending to the groove and leaving a gap between the first and second metal layers (SS2); forming a plurality of partition walls that fill the gap while a portion of the first metal layer formed on a bottom of the groove and a portion of the second metal layer adjacent to the gap are exposed, on the first and second metal layers (SS3); forming an electron transport layer on a predetermined portion of the first metal layer formed on the bottom of the groove (SS4); forming an organic light emitting layer on the electron transport layer (SS5); forming a hole transport layer on the organic light emitting layer (SS6) and in contact with an exposed portion of the second metal layer between the partition walls; and (SS7) forming and sealing a protecting layer that covers the elements formed on the groove.

<Manufacturing of Second Embodiment>

As shown in FIG. 4, a groove 82 may be formed in a substrate 80. The substrate 80 may be a p-type silicon substrate. The groove 82 may be formed like the groove 22 formed in the manufacturing method of the previous embodiment. A conductive impurity, such as an n-type impurity, may be injected into the bottom 82a of the groove 82, thereby forming a doped region 84. Like the first metal layer 24a of the first embodiment, the doped region 84 may be used as a cathode layer.

A mask (not shown) exposing the bottom 82a of the groove 82 and a flat surface 82b of the groove 82 and covering the rest porton may be used to form fifth, sixth, and seventh metal layers 92a, 92b, and 92c on the inner surface of the groove 82 where steps are not formed and on the fifth and sixth steps S5 and S6, respectively. The mask may then be removed.

The fifth and sixth metal layers 92a and 92b are used as reflecting layers that reflect light that is incident in a lateral direction upward. The seventh metal layer 92c is used as an anode layer. The sixth and seventh metal layers 92b and 92c may extend onto the flat surface 82b of the groove 82, but it is preferable that a gap g2 be formed between the sixth and seventh metal layers 92b and 92c on the flat surface 82b.

An insulating layer (not shown) may be formed on the substrate 80 using a mask (not shown) covering a portion of the seventh metal layer 92c extending onto the flat surface 82b of the groove 82, the bottom 82a of the groove 82, and a portion around the groove 82. The insulating layer may be a silicon oxide layer.

After the insulating layer is formed, the mask is removed, thereby forming a seventh partition wall 94 that completely fills a space between the sixth and seventh metal layers 92b and 92c. Also, an eighth partition wall 96 may be formed on the inner surface of the groove 82 where no steps are formed. Additionally, a ninth partition wall 98 may be formed on the fifth step S5.

The seventh partition wall 94 may extend downward to the bottom 82a of the groove 82 across the sixth step S6. A portion of the seventh partition wall 94 may extend onto the seventh metal layer 92c. The seventh partition wall 94 and the ninth partition wall 98 may be separated a predetermined distance on the seventh metal layer 92c due to the mask.

Processes forming an organic light emitting layer 100 and a hole transport layer 102 (on which the seventh through ninth partition wall 94, 96, and 98 may be formed) may be performed according to the method of manufacturing an organic light emitting device by the first embodiment. After the hole transport layer 102 is formed, a protecting layer 104 may be formed to protect elements inside the eighth and ninth partition walls 96 and 98. The protecting layer 104 may be formed like the protecting layer 40 (FIG. 2) formed in the previous embodiment.

Spaces between the protecting layer 104 and the seventh metal layer 92c and between the protecting layer 104 and the substrate 80 may be sealed with a sealing material 106.

Figure 7:
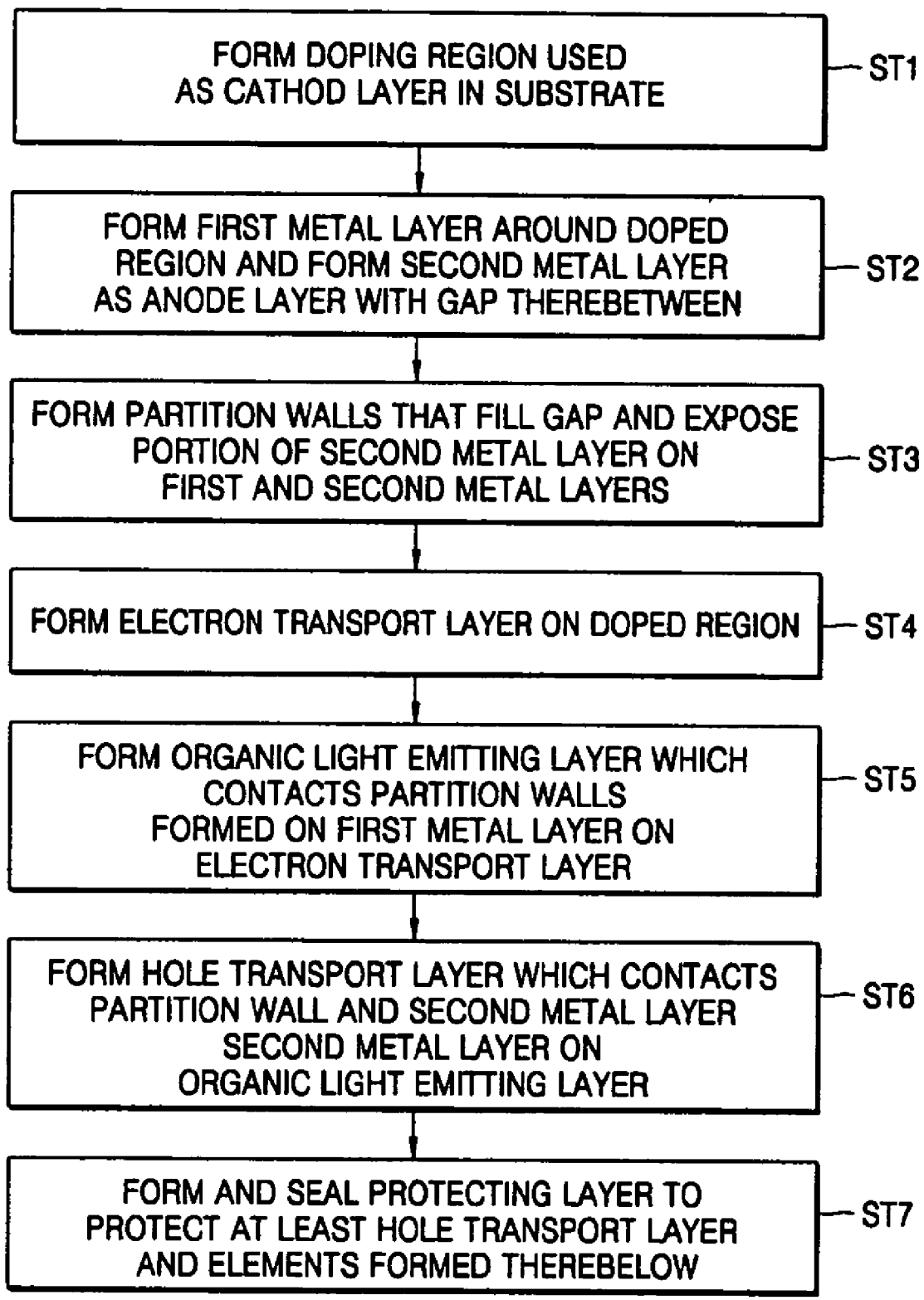

As shown in FIG. 7, the manufacturing method according to the second embodiment of the present invention can be summarized as follows. The manufacturing method can include forming a doped region as a cathode layer in a substrate (ST1); forming first and second metal layers separated by a gap on the substrate around the doped region (ST2) (the second metal layer may be used as an anode layer); forming a plurality of the partition walls filling the gap and exposing a predetermined portion of the second metal layer contacting the gap on the first and second metal layers (ST3); forming an electron transport layer on the doped region (ST4); forming an organic light emitting layer contacting the partition walls formed on the first metal layer on the electron transport layer (ST5); forming a hole transport layer contacting the partition walls and the second metal layer on the organic light emitting layer (ST6); and forming and sealing a protecting layer to protect at least the hole transport layer and elements formed below the hole transport layer (ST7). In this summary, the first metal layer may correspond to the fifth and sixth metal layers 92a and 92b illustrated in FIG. 4, and the second metal layer may correspond to the seventh metal layer 92c illustrated in FIG. 4.

An organic light emitting device according to the present invention may not include an ITO electrode layer. Therefore, the entire manufacturing process may be shorter and less costly. Moreover, the organic light emitting device of the present invention can be applied to flexible displays.

In addition, the organic light emitting device according to the present invention can improve luminance efficiency because it includes a reflecting material, by which light emitted horizontally from an organic light emitting layer or reflected in a lateral direction is reflected upward.

In an organic light emitting device manufactured according to the present invention, the surface state and thickness of the hole transport layer may have little effect on the performance of the organic light emitting device. In general, the organic light emitting device according to the present invention may have fewer factors affecting performance. Moreover, the present invention may obviate the need for an indium-tin-oxide (ITO) or indium-zinc-oxide (IZO) layer. Accordingly the fabrication temperature of the device may be reduced, and the organic material may be more easily preserved.

While the present invention has been particularly shown and described with reference to exemplary embodiments thereof, various changes may be made to the described embodiments without departing from the scope of the invention.

For example, coupling materials equivalent in function to the coupling materials 42 and 40a illustrated in FIG. 2 may be formed in a portion of the protecting layer 104 extending beyond the groove 82 and in a predetermined portion of the substrate 80 facing the portion of the protecting layer 104, but this is still within the scope of the invention.

What is claimed is:

1. A method for manufacturing an organic light emitting device, comprising:

forming a groove in a substrate;

forming a first metal layer and a second metal layer extending into the groove on the substrate, a gap is formed between the first metal layer and the second metal layer;

forming partition walls that fill the gap on the first metal layer and the second metal layer while a portion of the first metal layer formed on a bottom of the groove and a portion of the second metal layer adjacent to the gap are exposed;

forming an electron transport layer on a portion of the first metal layer formed on the bottom of the groove;

forming an organic light emitting layer on the electron transport layer;

forming a hole transport layer contacting an exposed portion of the second metal layer between the partition walls on the organic light emitting layer; and forming and sealing a protecting layer covering all of the elements formed in the groove.

2. The method of claim 1, wherein the groove is formed asymmetrically with a slight sloped inner surface.

3. The method of claim 2, wherein the groove is formed by forming a first step and a second step in the groove, forming the second step in contact with the bottom of the groove and separate from the first step, and forming a flat surface between the first and second steps.

4. The method of claim 1, wherein the forming the first metal layer and the second metal layer further comprises:

forming a mask on the substrate where the gap is to be formed;

forming a metal layer on a portion of the substrate exposed by the mask; and removing the mask.

5. The method of claim 1, wherein forming partition walls further comprises:

forming a mask exposing a region where the partition walls are to be formed;

forming an insulating layer that fills the gap on the substrate using the mask; and removing the mask.

6. The method of claim 1, wherein forming the first metal layer and the second metal layer comprises forming a first coupling material on a portion of the first metal layer around the groove.

7. The method of claim 6, wherein forming and sealing a protecting layer comprises forming a second coupling material to the protecting layer, the second coupling material facing the first coupling material.

8. The method of claim 7, wherein the first coupling material comprises a protruding portion and the second coupling material comprises a groove adapted to receive the protruding portion.

9. The method of claim 1, wherein forming a groove further comprises:

forming a base substrate;

forming a glass substrate on the base substrate; and forming a penetrating hole exposing the base substrate in the glass substrate, wherein an inner surface of the penetrating hole is shared with that of the groove.

10. The method of claim 1, wherein the electron transport layer is a single layer or multiple layers.

11. The method of claim 1, wherein the protecting layer closely adheres to the following: the hole transport layer, portions of the partition walls exposed on the hole transport layer, and portions of the first metal layer and the second metal layer around the groove.

12. The method of claim 1, further comprising failing to include both indium-tin-oxide (ITO) and indium-zinc-oxide (IZO).

* * * * *